United States Patent
Lin et al.

(10) Patent No.: US 7,508,776 B2
(45) Date of Patent: Mar. 24, 2009

(54) CONTROLLING METHOD AND DEVICE FOR DATA TRANSMISSION

(75) Inventors: Kevin Lin, Hsin-Tien (TW); Morris Chu, Hsin-Tien (TW)

(73) Assignee: Tian Holdings, LLC, Wilmington, DE (US)

( * ) Notice: Subject to any disclaimer, the term of this patent is extended or adjusted under 35 U.S.C. 154(b) by 734 days.

(21) Appl. No.: 10/824,440

(22) Filed: Apr. 15, 2004

(65) Prior Publication Data

US 2005/0036453 A1    Feb. 17, 2005

(51) Int. Cl.
- H04L 12/54    (2006.01)
- H04J 3/02    (2006.01)
- G06F 15/00    (2006.01)
- G06F 15/173    (2006.01)

(52) U.S. Cl. ............. 370/258; 370/428; 370/462; 709/216; 709/238; 712/11

(58) Field of Classification Search ......... 370/258–428, 370/216–238; 711/127–157; 712/11–29; 709/216–238

See application file for complete search history.

(56) References Cited

U.S. PATENT DOCUMENTS

| | | | | |
|---|---|---|---|---|
| 4,644,466 A | * | 2/1987 | Saito | 712/218 |
| 5,355,508 A | * | 10/1994 | Kan | 712/20 |
| 5,475,856 A | * | 12/1995 | Kogge | 712/20 |
| 5,559,986 A | * | 9/1996 | Alpert et al. | 711/144 |
| 5,640,534 A | * | 6/1997 | Liu et al. | 711/146 |
| 5,740,402 A | * | 4/1998 | Bratt et al. | 711/157 |
| 5,778,221 A | * | 7/1998 | Temple | 712/244 |
| 5,805,855 A | * | 9/1998 | Liu | 711/108 |
| 5,805,915 A | * | 9/1998 | Wilkinson et al. | 712/20 |
| 6,202,128 B1 | * | 3/2001 | Chan et al. | 711/131 |
| 6,643,763 B1 | * | 11/2003 | Starke et al. | 712/11 |
| 6,990,556 B2 | * | 1/2006 | Check et al. | 711/127 |
| 2003/0056052 A1 | * | 3/2003 | Ehmann et al. | 710/305 |
| 2005/0027966 A1 | * | 2/2005 | Hu et al. | 712/36 |
| 2005/0111481 A1 | * | 5/2005 | Lin | 370/462 |
| 2005/0283634 A1 | * | 12/2005 | Rai | 713/600 |

* cited by examiner

Primary Examiner—Man Phan
(74) Attorney, Agent, or Firm—Perkins Coie LLP

(57) ABSTRACT

A controlling method and device for data transmission including the steps of providing a system bus for connecting a first transmission channel and a second transmission channel with a command processor, adjusting a transmitting direction of the system bus according to a transmitting direction of the second transmission channel, and proceeding the data processing procedures of the second transmission channel, wherein parts of data processing procedures of the first transmission channel will last during a interval between the system bus adjusting the transmitting direction and the data processing procedures of the second transmission channel start on.

The present invention ensure that the independence between every data caching and processing reduces the times of flushing the cached data from the data transmission channel and re-seeking through the source, shortening the transmission time, increasing facileness and improving the efficiency of the data transmission.

17 Claims, 5 Drawing Sheets

CONTROLLING METHOD AND DEVICE FOR DATA TRANSMISSION

BACKGROUND OF THE INVENTION

1. Field of the Invention

The invention relates to the field of data buffer, and more particularly to a controlling method and device for data transmission in the dual buffer architecture.

2. Description of the Related Art

To satisfy the higher demand of the quality of the audio and video image, the corresponding multimedia standards have been built up. Since the multimedia data usually require more space to storage and bandwidth to transmit, the corresponding buffer which set up in a player as a data transmission channel is in great demand than before. However, due to the conventional transmission channel devices typically lack of planning such that the switch and intercommunication was impeded and then lower the overall performance.

With regard to the above-mentioned, FIG. 1A is a schematic diagram illustrating the method and device of a buffer as a data transmission channel based on the related art including a data transmission channel 100 as a data buffer that constructed between a host and a peripheral such as a CD-R drive or a CD-RW drive, or constructed in a DVD Player or DVD Recorder, and a system bus 110 coupling to the host. When the system command is "Host Read", the data sequentially sent to and cached in the data transmission channel 100 before decoding and consequent transmission procedures. However, while the bus adjusting the direction according consequent system command, the data cached in the data transmission channel 100 may be discarded (i.e. "Flush") so that the data transmission channel 100 which as a common area for temporary storage employed by the data of the successive commands, and the corresponding index modifying its value frequently and terminated all the data processing procedures of the formal command when the last one begin to perform. Consequently, when the incessant switch between random two commands occur frequently, the data transmission channel 100 will result in the shortcomings that consuming the transmission time, transmission not smooth, and lower the performance while waiting the mechanical components to access data, flushing the content of the buffer, re-seeking the raw data, modifying the content of the corresponding indices, etc.

FIG. 2 representing a flowchart of the method for the data transmission channel based on the prior art including steps 210 to 250. At first, Step 210 indicates that the first command data processing procedures based on the first command to transmit the data between the data transmission channel 100 and the bus 110. It's noted that when the first command is "Host Read", the data of the data transmission channel 100 flows into the bus 110, and the corresponding consequent data processing procedures including of caching data in the data transmission channel 100, decoding (in the channel CODEC), and sending the decoded data away form the data transmission channel 100. On the other hand, when the first command is "Host Write", the data of the bus 110 flows into the data transmission channel 100, and the corresponding consequent data processing procedures including caching data in the data transmission channel 100, encoding (in the channel CODEC), sending the encoded data away form the data transmission channel 100 and performing related recording procedures. Second, the bus 110 adjusting the transmitting direction in step 220 through comparing the second command to the first one, and taking step 230 for retrieving and caching the data of the second command in the data transmission channel 100 that the location of the cached data will follows the one of the first command since these two commands are the same, otherwise taking step 240 to discard the data of the first command that cached in the data transmission channel 100, and performing the related procedures in step 250. It's noted that the parts of processing procedures of the first command will terminate when the data processing procedures of the second command began to perform, or it will result in the problem associated with inconsistence and incorrectness of data processing.

Hence, the above discussion on the techniques of prior art have at least two drawbacks. First, the decoded and cached data will be discarded when the command "Host Read" switched to the command "Host Write", and also it will cause delays since the common and single data transmission channel can't be use by the command "Host Write" and the command "Host Read" at one time. Second, while the incessant switch between random two commands occur frequently, it may cause the frequent re-seeking, exhausting the transmission time, and lacking of efficiency, etc.

SUMMARY OF THE INVENTION

A controlling method for data transmission comprising the steps of providing a system bus for connecting a first transmission channel and a second transmission channel with a command processor, adjusting a transmitting direction of the system bus according to a transmitting direction of the second transmission channel, and proceeding data processing procedures of the second transmission channel according the transmitting direction of the second transmission channel, wherein parts of data processing procedures of the first transmission channel will last during a interval between the system bus adjusting the transmitting direction and the data processing procedures of the second transmission channel start on.

A method for controlling a caching location and a processing timing of data in a data transmission channel module comprising the steps of determining a data transmission channel of the data transmission channel module according to a command issued by a command processor, and parts of processing procedure of a first transmission channel of the data transmission channel module will last for a time interval even though a second transmission channel of the data transmission channel module obtains the ownership of a common transmitting path.

A device apply to an optoelectronic system as a data transmission channel module comprising a first transmission channel bounded by a pair of pipe indices for caching and transmitting data with a first processing procedures; and a second transmission channel bounded by a pair of pipe indices for caching and transmitting data with a second processing procedures.

The present invention providing at least two data transmission channels to ensure that the independence between every data caching and processing reduces the times of flushing the cached data from the data transmission channel and re-seeking through the source, shortening the transmission time, increasing facileness and improving the efficiency of the data transmission.

BRIEF DESCRIPTION OF THE DRAWINGS

These and other objects, features, and advantages of the present invention will become better understood with regard to the following description, and accompanying drawings where.

DESCRIPTION OF THE PREFERRED EMBODIMENT

Figure 1A:
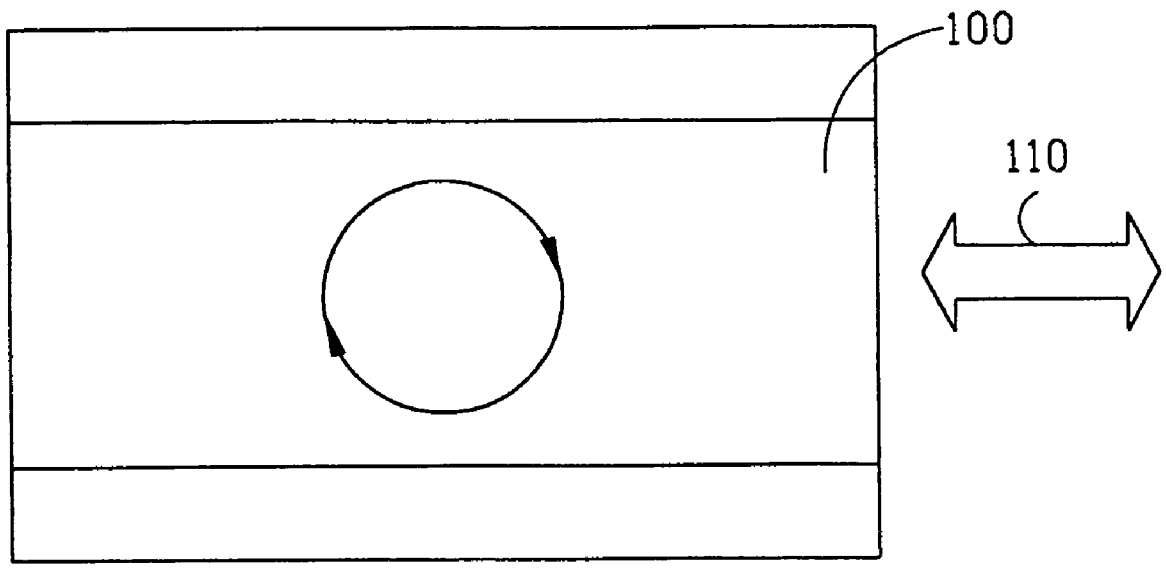
FIG. 1A is a schematic diagram illustrating the method and device of a buffer as a data transmission channel based on the related art.
Figure 1B:
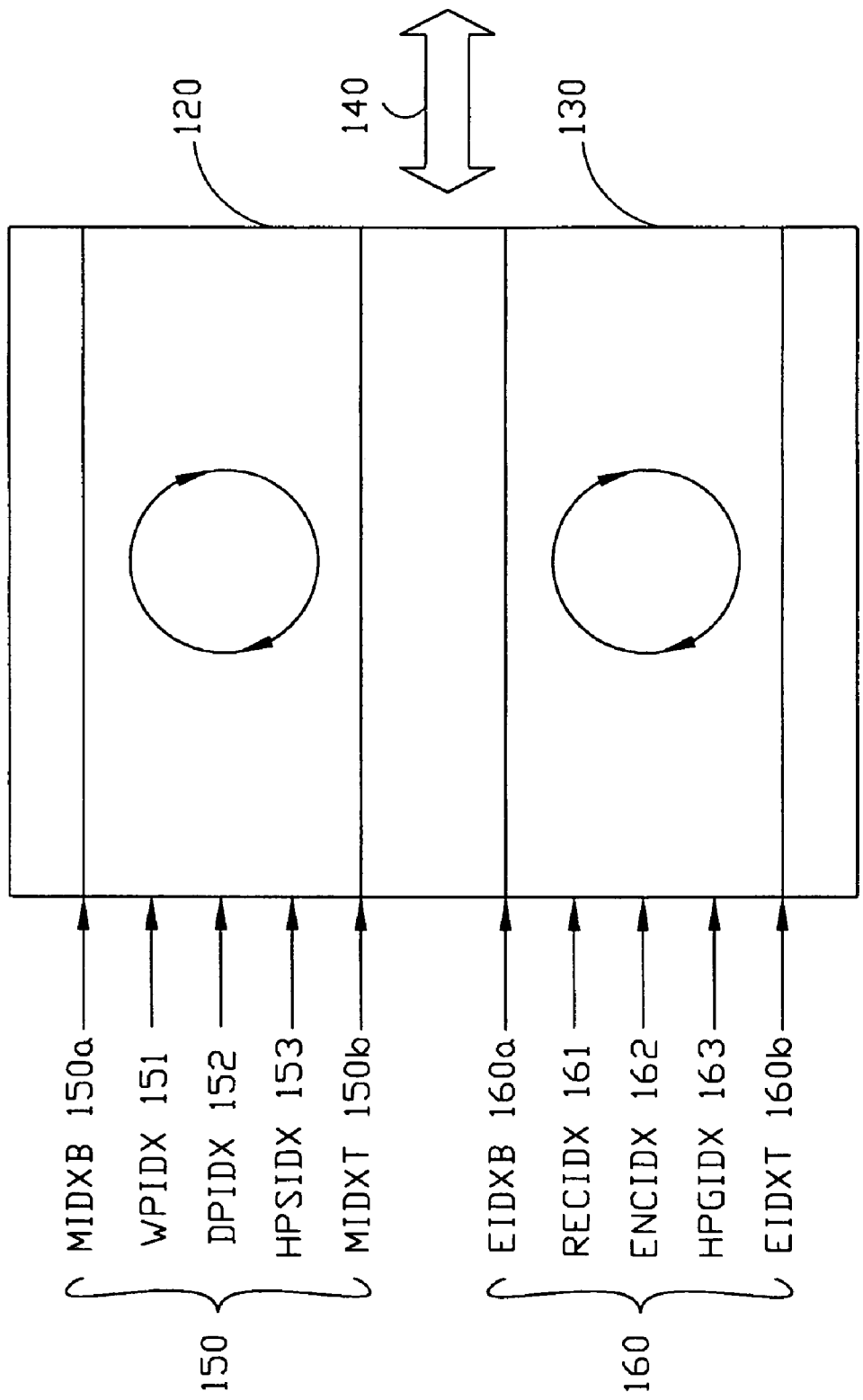
FIG. 1B is a schematic diagram illustrating the method and device based on an embodiment of the present invention.

FIG. 1B a schematic diagram illustrating the method and device of the data transmission channels based on an embodiment of the present invention wherein the device including at least two transmission channels 120 and 130 which are constructed for providing temporary zone for data transmission and buffering, and further coupled to a channel CODEC for data encoding and data decoding (not shown in FIG. 1B), and a bus 140 coupling the first data transmission channel 120 and the second data transmission channel 130 to a command processor (not shown in FIG. 1B) such as a host. The first data transmission channel 120 is coupled to pipe indices 150 including MIDXT 150a and MIDXB 150b and further including a write pipe index WPIDX 151, a decode pipe index DPIDX 152, and a host-pipe sector data send index HPSIDX153 when the corresponding data transmission channel is a decoded data buffer. The second data transmission channel 130 is coupled to pipe indices 160 including EIDXT 160a and EIDXB 160b and further including a record pipe index RECIDX 161, an encode pipe index ENCIDX 162, and a host-pipe sector data get index HPGIDX 163 when the corresponding data transmission channel is a encoded data buffer. In an embodiment, if the command is "Host Read", the source data will be cached in the data transmission channel 120, decoded in the channel CODEC, delivered to the bus 140, and then the corresponding pipe indices value will be adjusted. If the command is "Host Write", the source data will be transmitted to and cached in the data transmission channel 130 through the bus 140, encoded, sent to the destination, and then the corresponding pipe indices value will be adjusted.

Figure 3:
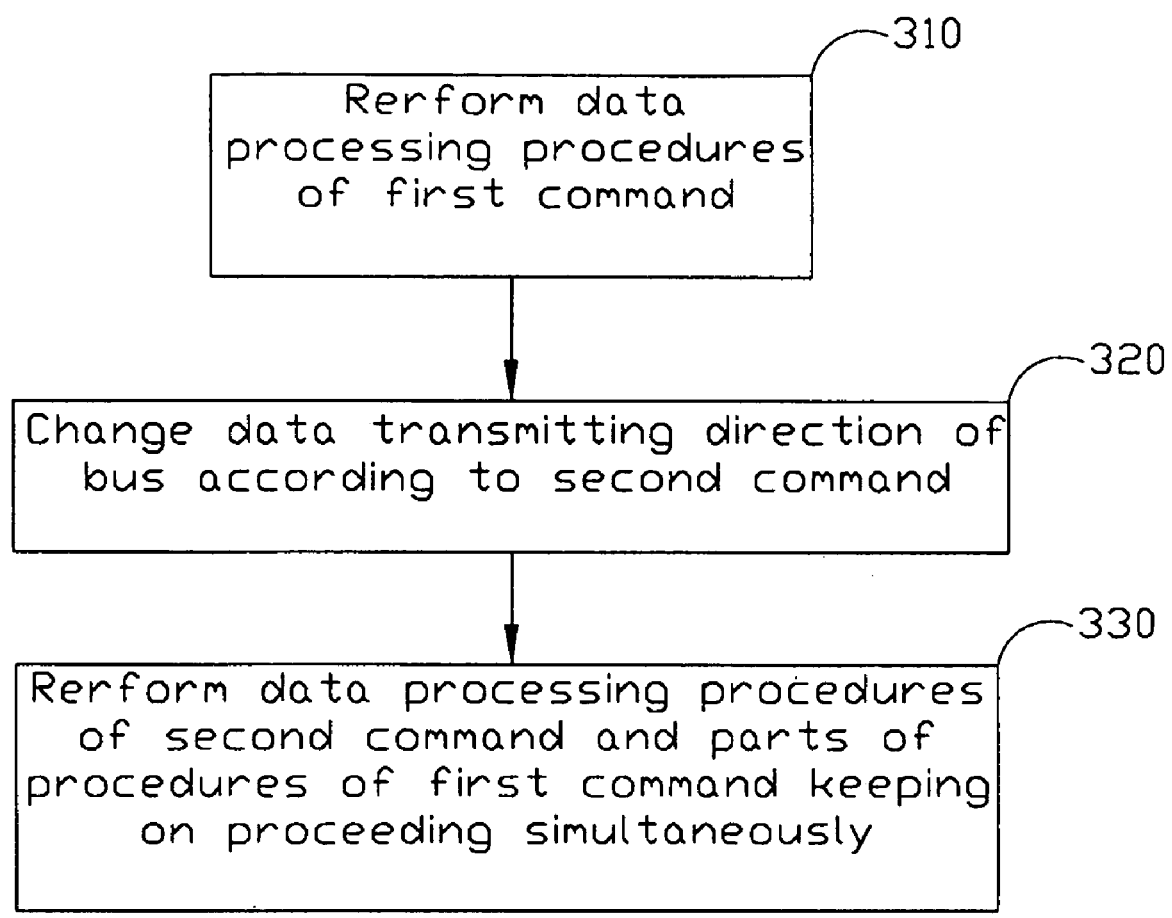
FIG. 3 is a flowchart illustrating the controlling method and device for data transmission based on an alternative embodiment of the present invention.

FIG. 3 is a flowchart illustrating the controlling method and device for data transmission based on an alternative embodiment of the present invention. The corresponding data transmission channel and the successive processing procedures include encoding and storing to a peripheral if the command is "Host Write", and decoding the data and delivering the decoded data to the bus 140 if the command is "Host Read" in the step 310. Step 320 is the step for the bus 140 to determine the transmitting direction based on the second command. In step 330, the data processing procedures of the second command start, and the parts of data processing procedures of the first data transmission channel continue to proceed simultaneously with the data processing procedures of the second command. This operation is different because in a normal system, the data retrieving process and the data decoding of the first command may not proceed in the channel CODEC or use the pickup head (PUH) of the CD-RW drive while data is being transmitted to the bus 140 by the second command. The data processing procedures of the first command may last for a short period of time. The inventive system allows the concurrence of the "Host Write" and "Host Read" commands since the data processing procedures of the two commands may be proceeding in the different elements of the system at the same time.

Figure 4:
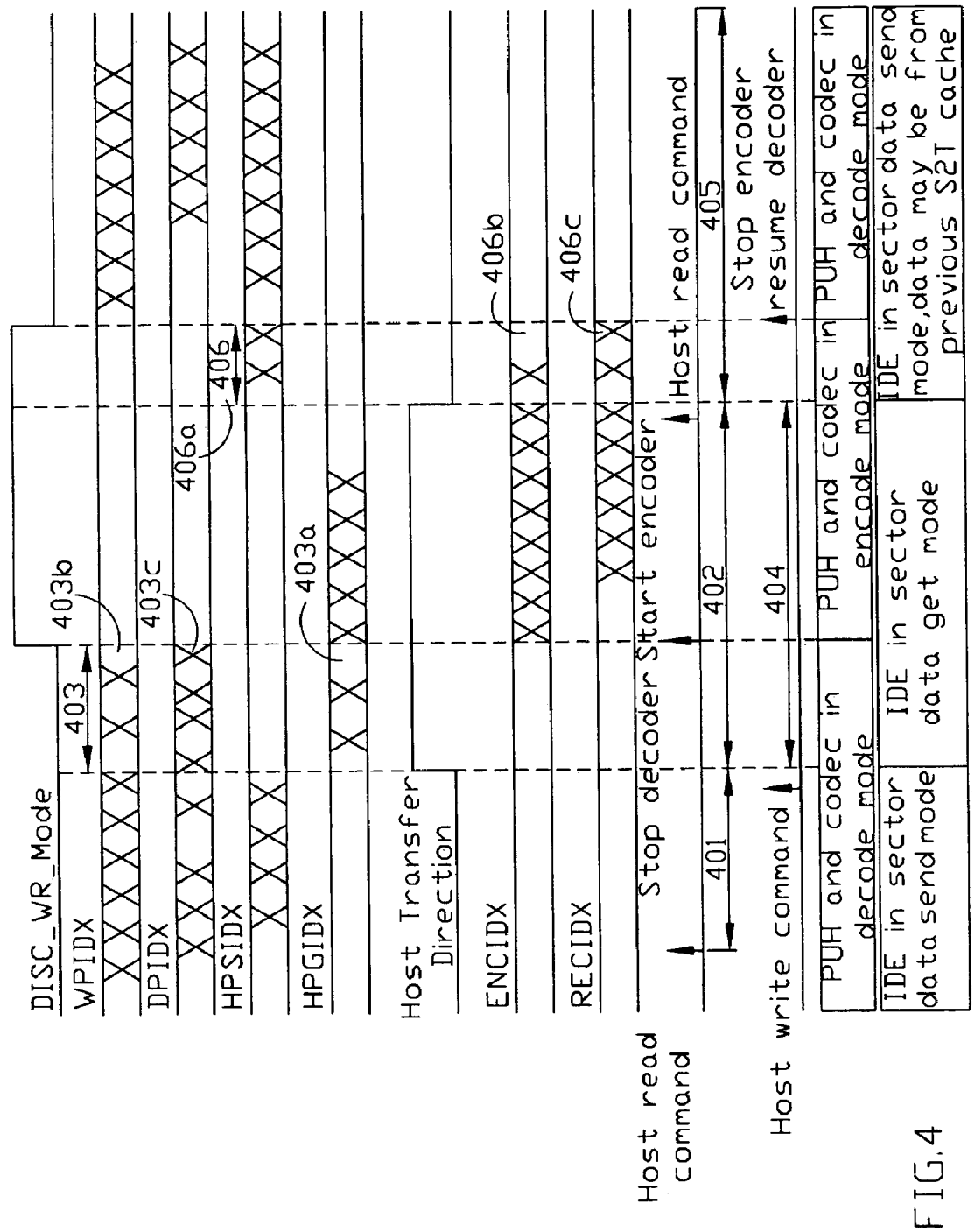
FIG. 4 is a timing diagram illustrating the method based on another alternative embodiment of the present invention.

FIG. 4 is a timing diagram illustrating the method based on another alternative embodiment of the present invention. Since the first command is "Host Read", label 401 shows that the pickup head and the data transmission channel are both in the decode mode, and the Integrated Device Electronics (IDE) is in the sector. data send mode. Once the first command began to be performed and the flag "DISC_WR_Mode" is in the low level, the data retrieved sequentially and cached in the first data transmission channel 120 which resulted in the WPIDX 151 changed values, decoded in the channel CODEC which changed the values of DPIDX 152, and sent to the bus 140 which changed the values of HPSIDX 153. If the successive command is "Host Write", label 402 shows that the bus adjusted the direction to couple to the second data transmission channel 130 and the IDE is in the sector data get mode, and then the data will be cached in the second data transmission channel 130 which resulted in the HPGIDX 163 changed values, and once the flag "DISC_WR_Mode" is in the high level, the data encoded which changed the values of ENCIDX 162, and then stored in the peripheral which changed the values of RECIDX 161. Besides, label 403 comprises 403a, 403b, and 403c. Once the second command began to be performed, the bus 140 adjusts the data transmitting direction and the values of HPGIDX 153 starts to change whereas the values of HPSIDX 163 stopped to change, as shown in 403a. To the peripheral and the channel CODEC, the conflict will not result from adjusting of the direction of the bus 140, the data retrieving and decoding of the first command could last until the flag "DISC_WR_Mode" pulled to high, as shown in 403b and 403c. Consequently, label 403 shows the characteristic of the present invention.

On the other hand, consider the situation that the first command is "Host Write" and the second command is "Host Read", since the first command began to be performed, the pickup head and the data transmission channel are both in the encode mode, and the IDE is in the sector data get mode. Once the flag "DISC_WR_Mode" is in the high level, the data will be retrieved sequentially from the bus 140 and cached in the second data transmission channel 130 which changed the values of HPGIDX 163, and then encoded in the channel CODEC which changed the values of ENCIDX 162, and sent to the peripheral to store which changes the values of RECIDX 161, as shown in label 404. When the second command begins, the pickup head and the data transmission channel are both in the decode mode, the IDE is in the sector data send mode, the data is cached in the first data transmission channel 120, decoded, and sent to the bus 140. The values of the WPIDX 151, DPIDX 152, and HPSIDX 153 change, as shown in the label 405. Label 406 comprises 406a, 406b, and 406c. When the second command begins to be performed, the transmitting direction of the bus 140 will be adjusted, and the values of HPSIDX 153 starts to change whereas the values of HPGIDX 163 stopped to change, as shown in 406a. To the peripheral and the second data transmission channel 130, the conflict will not resulted from the bus 140 adjusting the direction, hence the data encoding and storing will last before the "DISC_WR_Mode" pulled to low level, as shown in 406b and 406c.

In an embodiment, if the successive commands are both "Host Read", and the corresponding data transmission channel has the decoded data which is waiting to be processed, then the decoded data can be sent to the bus 140 during the interval before the bus 140 changing the transmitting direction and reduce the times of the "Flush", and hence shortening the transmission time, increasing facileness and improving the efficiency of the data transmission.

In an embodiment, if a sequence of three commands is "Host Read", "Host Write", and "Host Read" or "Host Write", "Host Read", and "Host Write", the data is buffered via the corresponding transmission channel and the cached data in the transmission channel should not to be discarded frequently to accommodate successive commands. In other words, since the data transmitting process may utilize a different transmission channel the successive processing of the data cached in the data transmission channel will not be interfered with when another command begins to be performed.

While the invention has been described by way of example and in terms of preferred embodiment, it is to be understood that the invention need not be limited to the disclosed embodiments. On the contrary, it is intended to cover various modifications and similar arrangements included within the spirit of appended claims, the scope of which should be accorded the broadest interpretation so as to encompass all such modifications and similar structures.

What is claimed is:

1. A method for controlling data transmission, comprising:
   providing a system bus that is configured to connect both a first transmission channel and a second transmission channel to a command processor;
   adjusting a transmission direction of the system bus according to a transmission direction of the second transmission channel;
   performing data processing procedures on data of the second transmission channel according to the transmission direction of the second transmission channel; and
   performing at least some data processing procedures on data of the first transmission channel while adjusting the transmission direction of the system bus, wherein the at least some data processing procedures on data of the first transmission channel includes at least one of:
      caching data of the first transmission channel while transmitting data from the first transmission channel to the system bus;
      decoding data of the first transmission channel while transmitting data from the first transmission channel to the system bus;
      encoding data of the second transmission channel while transmitting data from the system bus to the second transmission channel; or
      storing data of the second transmission channel to a storage medium while transmitting data from the system bus to the second transmission channel.

2. The method of claim 1, wherein the performing at least some data processing procedures on data of the first transmission channel includes:
   caching and decoding data of the first transmission channel while transmitting data from the first transmission channel to the system bus.

3. The method of claim 1, wherein the performing at least some data processing procedures on data of the first transmission channel includes:
   encoding and storing data of the second transmission channel to a storage media while transmitting data from the system bus to the second transmission channel.

4. A method for controlling a data transmission channel module, comprising:
   identifying an active data transmission channel from a first transmission channel and a second transmission channel of the data transmission channel module according to a command issued by a command processor, and
   performing at least some processing procedures on data of the first transmission channel during a time period in which the second transmission channel utilizes a common transmission path, including:
      utilizing the first transmission channel to cache data from a first source while a first command is issued by the command processor; and
      utilizing the second transmission channel to cache data from a second source while a second command is issued by the command processor, wherein the first command is at least one of a read command or a write command, and wherein the second command is at least one of a read command or a write command.

5. The method of claim 4,
   wherein the second command is issued after the first command, and wherein the first command is a read command and the second command is a write command.

6. The method of claim 4, further comprising:
   utilizing the first transmission channel to cache a third source data if a third command is issued by the command processor, wherein the third command is a read command that is issued after the second command.

7. The method of claim 4, further comprising:
   utilizing the second transmission channel to cache a third source data if a third command is issued by the command processor, wherein the third command is a write command that is issued after the second command.

8. The method of claim 4,
   wherein the second command is issued after the first command, and wherein the first command is a read command and the second command is a read command.

9. The method of claim 4,
   wherein the second command is issued after the first command, and wherein the first command is a write command and the second command is a read command.

10. The method of claim 9, further comprising:
    utilizing the first transmission channel to cache data from a third source data while a third command issued by the command processor, wherein the third command is a write command that is issued after the second command.

11. The method of claim 4,
    wherein the second command is issued after the first command, and wherein the first command is a write command and the second command is a write command.

12. A data transmission channel module for an optoelectronic system, comprising:
    a first transmission channel configured to be controlled with a first set of pipe indices to cache and transmit data with a first processing procedure; and
    a second transmission channel configured to be controlled with a second set of pipe indices to cache and transmit data with a second processing procedure, wherein if the first processing procedure includes data decoding, the set of pipe indices comprise:
       a write pipe index configured to indicate an amount of cached data in a transmission channel corresponding to the first processing procedure;
       a decode pipe index configured to indicate an amount of decoded data; and
       a host-pipe sector data send index configured to indicate an amount of data transmitted from the transmission channel corresponding to a command processor.

13. The device of claim 12, wherein the optoelectronic system is a DVD Player or a DVD Recorder.

14. The device of claim 12, wherein the first transmission channel and the second transmission channel are coupled to a channel CODEC that is configured to decode data of the first transmission channel and to encode data of the second transmission channel.

15. The device of claim 12, wherein if the first processing procedure includes data encoding, the set of pipe indices comprising:
   a host-pipe sector data get index configured to indicate an amount of data sent from a command processor to a corresponding transmission channel;
   an encode pipe index configured to indicate an amount of encoded data; and
   a record pipe index configured to indicate an amount of encoded data transmitted from the corresponding transmission channel to a storage medium.

16. The device of claim 12, further comprising a bus configured to couple both the first transmission channel and the second transmission channel to a command processor to enable data transmission between the first transmission channel and the command processor and between the second transmission channel and the command processor.

17. The method of claim 1, wherein performing at least some data processing procedures on data of the first transmission channel while adjusting the transmission direction of the system bus includes:
   performing at least some data processing procedures on data of the first transmission channel while adjusting the transmission direction of the system bus and starting at least some data processing procedures on data of the second transmission channel.

* * * * *

UNITED STATES PATENT AND TRADEMARK OFFICE
CERTIFICATE OF CORRECTION

PATENT NO. : 7,508,776 B2 Page 1 of 1
APPLICATION NO. : 10/824440
DATED : March 24, 2009
INVENTOR(S) : Kevin Lin et al.

Figure 2:
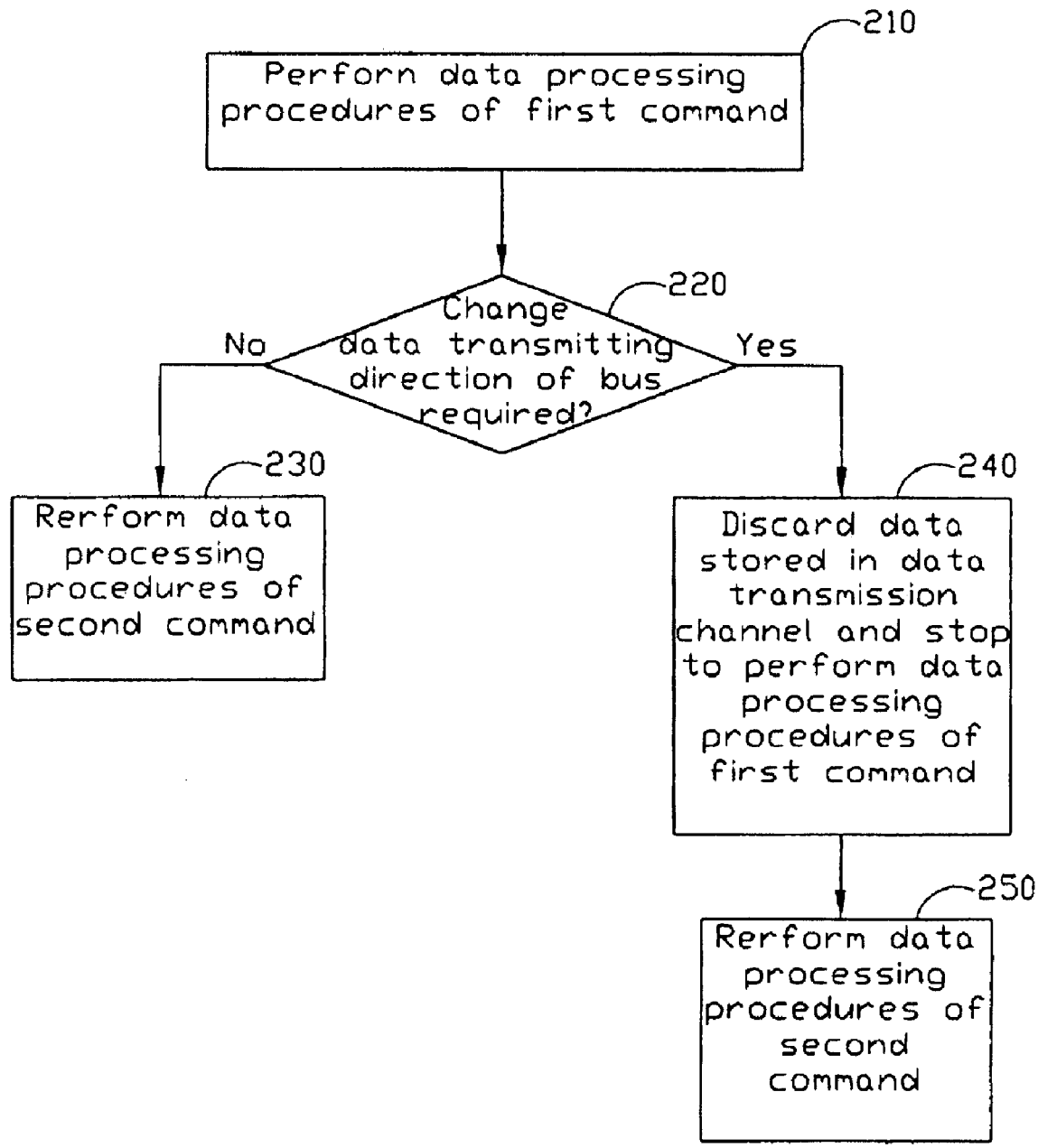
FIG. 2 is a flowchart of the method for the data transmission channel based on the related art.

It is certified that error appears in the above-identified patent and that said Letters Patent is hereby corrected as shown below:

In the drawings:

On sheet 3 of 5, in (Box 210) (FIG. 2), line 1 delete "Perforn" and insert -- Perform --, therefore.

On sheet 3 of 5, in (Box 230) (FIG. 2), line 1 delete "Rerform" and insert -- Perform --, therefore.

On sheet 3 of 5, in (Box 250) (FIG. 2), line 1 delete "Rerform" and insert -- Perform --, therefore.

On sheet 4 of 5, in (Box 310) (FIG. 3), line 1 delete "Rerform" and insert -- Perform --, therefore.

On sheet 4 of 5, in (Box 330) (FIG. 3), line 1 delete "Rerform" and insert -- Perform --, therefore.

In column 4, line 9, delete "sector. data" and insert -- sector data --, therefore.

In column 4, line 45, delete "values" and insert -- value --, therefore.

In column 4, line 67, delete "times" and insert -- time --, therefore.

Signed and Sealed this

Second Day of June, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,508,776 B2  Page 1 of 1
APPLICATION NO. : 10/824440
DATED : March 24, 2009
INVENTOR(S) : Lin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1083 days.

Signed and Sealed this

Twenty-sixth Day of October, 2010

David J. Kappos
*Director of the United States Patent and Trademark Office*